(12) United States Patent
Song et al.

(10) Patent No.: US 11,658,160 B2
(45) Date of Patent: May 23, 2023

(54) SEMICONDUCTOR PACKAGE AND METHOD OF MANUFACTURING THE SAME

(71) Applicant: Samsung Electronics Co., Ltd., Suwon-si (KR)

(72) Inventors: Hyeonjun Song, Hwaseong-si (KR); Eunkyul Oh, Gwacheon-si (KR); Hyeongmun Kang, Hwaseong-si (KR); Jungmin Ko, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/574,953

(22) Filed: Jan. 13, 2022

(65) Prior Publication Data

US 2022/0139881 A1  May 5, 2022

Related U.S. Application Data

(63) Continuation of application No. 17/030,588, filed on Sep. 24, 2020, now Pat. No. 11,257,794.

(30) Foreign Application Priority Data

Feb. 26, 2020 (KR) ........................ 10-2020-0023342

(51) Int. Cl.
*H01L 23/00* (2006.01)
*H01L 25/065* (2023.01)
(Continued)

(52) U.S. Cl.
CPC ...... *H01L 25/0657* (2013.01); *H01L 21/4871* (2013.01); *H01L 21/563* (2013.01);
(Continued)

(58) Field of Classification Search
CPC ............. H01L 25/0657; H01L 21/4871; H01L 21/563; H01L 21/565
See application file for complete search history.

(56) References Cited

U.S. PATENT DOCUMENTS 6,674,163 B1   1/2004  Andoh
6,858,941 B2   2/2005  Ference et al.
(Continued)

FOREIGN PATENT DOCUMENTS

JP    20050252074 A    9/2005
JP    20060344824 A    12/2006
(Continued)

OTHER PUBLICATIONS

Notice of Allowance dated Oct. 13, 2021, issued in corresponding U.S. Appl. No. 17/030,588.

*Primary Examiner* — Thao P Le
(74) *Attorney, Agent, or Firm* — Harness, Dickey & Pierce, P.L.C.

(57) ABSTRACT

A semiconductor package may include a package substrate, semiconductor chips, signal bumps, and first and second heat dissipation bumps. The semiconductor chips may be stacked on an upper surface of the package substrate, have first and second regions having different heat dissipation efficiencies. The second temperature may be higher than the first temperature. The signal bumps may be arranged between the semiconductor chips. The first heat dissipation bumps may be arranged between the semiconductor chips in the first region by a first pitch. The second heat dissipation bumps may be arranged between the semiconductor chips in the second region by a second pitch narrower than the first pitch. Heat generated from the second region of the semiconductor chips may be dissipated through the second heat dissipation bumps, which may be relatively closely arranged with each other.

20 Claims, 8 Drawing Sheets

(51) Int. Cl.
    *H01L 23/31*     (2006.01)
    *H01L 23/367*     (2006.01)
    *H01L 21/48*     (2006.01)
    *H01L 21/56*     (2006.01)
    *H01L 25/00*     (2006.01)

(52) U.S. Cl.
    CPC ........ *H01L 21/565* (2013.01); *H01L 23/3128* (2013.01); *H01L 23/367* (2013.01); *H01L 24/14* (2013.01); *H01L 25/50* (2013.01); *H01L 2224/1403* (2013.01); *H01L 2224/14132* (2013.01); *H01L 2224/14519* (2013.01); *H01L 2225/06513* (2013.01); *H01L 2225/06541* (2013.01); *H01L 2225/06586* (2013.01); *H01L 2225/06589* (2013.01)

(56) References Cited

U.S. PATENT DOCUMENTS

| | | |
|---|---|---|
| 7,123,480 B1 | 10/2006 | Andoh |
| 7,268,303 B2 | 9/2007 | Ashida |
| 7,372,169 B2 | 5/2008 | Chang |
| 7,514,768 B2 | 4/2009 | Andoh |
| 7,687,803 B2 | 3/2010 | Takagi et al. |
| 8,674,505 B2 | 3/2014 | Rhyner et al. |
| 10,014,283 B1 | 7/2018 | Chiang et al. |
| 10,630,296 B2 * | 4/2020 | Lee ........................ H01L 25/105 |
| 11,079,936 B2 | 8/2021 | Chang et al. |
| 11,159,166 B2 * | 10/2021 | Lee ..................... G11C 11/412 |
| 2008/0211079 A1 | 9/2008 | Onodera |
| 2011/0299265 A1 | 12/2011 | Nakatsu et al. |
| 2014/0293547 A1 | 10/2014 | Kung |
| 2014/0346661 A1 | 11/2014 | Liu et al. |
| 2014/0355215 A1 | 12/2014 | Canete et al. |
| 2015/0077941 A1 | 3/2015 | Hosseini et al. |
| 2015/0137345 A1 | 5/2015 | Choi et al. |
| 2015/0162260 A1 | 6/2015 | Liao |
| 2017/0358517 A1 | 12/2017 | Matsubara |
| 2020/0006300 A1 | 1/2020 | Baloglu et al. |
| 2020/0411439 A1 | 12/2020 | Teng et al. |
| 2021/0265315 A1* | 8/2021 | Song .................. H01L 25/0657 |

FOREIGN PATENT DOCUMENTS

| | | |
|---|---|---|
| JP | 4225243 B2 | 2/2009 |
| KR | 20060036433 A | 4/2006 |
| KR | 20150058940 A | 5/2015 |

* cited by examiner

SEMICONDUCTOR PACKAGE AND METHOD OF MANUFACTURING THE SAME

CROSS-RELATED APPLICATION

This application is a continuation of U.S. application Ser. No. 17/030,588, filed Sep. 24, 2020, which claims priority under 35 USC § 119 to Korean Patent Application No. 10-2020-0023342, filed on Feb. 26, 2020 in the Korean Intellectual Property Office (KIPO), the contents of each of which are herein incorporated by reference in their entirety.

BACKGROUND

1. Field

Some example embodiments relate to a semiconductor package and/or a method of manufacturing the same. More particularly, some example embodiments relate to a semiconductor package including stacked high bandwidth memory (HBM) chips, and/or a method of manufacturing the semiconductor package.

2. Description of Related Art

Generally, high bandwidth memory (HBM) chips may be stacked on an upper surface of a package substrate. The HBM chips may be electrically connected with the package substrate via signal bumps. Further, in order to dissipate heat generated from the HBM chips, heat dissipation bumps may be arranged between the HBM chips.

According to related arts, for example during operation, a central portion of the stacked HBM chips may have a temperature higher than a temperature of an edge portion of the stacked HBM chips. However, the heat dissipation bumps may be arranged spaced apart from each other by a same pitch. Thus, the central portion of the stacked HBM chips having the relatively high temperature may have low heat dissipation effect.

SUMMARY

Some example embodiments provide a semiconductor package having improved heat dissipation characteristics.

Some example embodiments also provide a method of manufacturing the above-mentioned stack packages.

According to some example embodiments, a semiconductor package may include a package substrate, a plurality of semiconductor chips, a plurality of signal bumps, a plurality of first heat dissipation bumps, and a plurality of second heat dissipation bumps. The plurality of semiconductor chips may be stacked on an upper surface of the package substrate. The semiconductor chips may have a first region and a second region. The plurality of signal bumps may be arranged between the semiconductor chips. The plurality of first heat dissipation bumps may be arranged between the plurality of semiconductor chips in the first region by a first pitch. The plurality of second heat dissipation bumps may be arranged between the plurality of semiconductor chips in the second region by a second pitch narrower than the first pitch such that the second region has a higher heat dissipation efficiency than the first region.

According to some example embodiments, a semiconductor package may include a package substrate, a plurality of semiconductor chips, a plurality of signal bumps and a plurality of heat dissipation bumps. The plurality of semiconductor chips may be stacked on an upper surface of the package substrate. The plurality of signal bumps may be arranged between the plurality of semiconductor chips. The plurality of heat dissipation bumps may be arranged between the plurality of semiconductor chips by gradually decreased pitches from an edge portion of the plurality of semiconductor chips to a central portion of the plurality of semiconductor chips.

According to some example embodiments, a semiconductor package may include a package substrate, a plurality of high bandwidth memory (HBM) chips, a plurality of signal bumps, a plurality of first heat dissipation bumps, a plurality of second heat dissipation bumps, and an underfilling layer. The plurality of HBM chips may be stacked on an upper surface of the package substrate. The plurality of HBM chips may have an edge region and a central region. Each of the plurality of HBM chips may include a plurality of signal posts, a plurality of first heat dissipation posts arranged in the edge region by a first pitch, and a plurality of second heat dissipation posts arranged in the central region by a second pitch of no more than ½ times the first pitch. The plurality of signal bumps may be arranged between the plurality of HBM chips. The plurality of signal bumps may be electrically connected to the plurality of signal posts. The plurality of first heat dissipation bumps may be arranged in the edge region by the first pitch. The plurality of first heat dissipation bumps may be connected to the plurality of first heat dissipation posts. The plurality of second heat dissipation bumps may be arranged in the central region by the second pitch. The plurality of second heat dissipation bumps may be connected to the plurality of second heat dissipation posts such that the central portion may have a higher heat dissipation efficiency than the edge portion. The underfilling layer may be between the plurality of HBM chips may surround the plurality of signal bumps, the plurality of first heat dissipation bumps and the plurality of second heat dissipation bumps.

According to some example embodiments, there may be provided a method of manufacturing a semiconductor package. In the method of manufacturing the semiconductor package, a plurality of semiconductor chips may be stacked on an upper surface of a package substrate. The plurality of semiconductor chips may have a first region and a second region. A plurality of signal bumps may be arranged between the plurality of semiconductor chips. A plurality of first heat dissipation bumps may be arranged between the plurality of semiconductor chips in the first region by a first pitch. A plurality of second heat dissipation bumps may be arranged between the plurality of semiconductor chips in the second region by a second pitch narrower than the first pitch such that the second region may have a higher heat dissipation efficiency than the first region.

According to some example embodiments, the second pitch of the second heat dissipation bumps in the high temperature region of the stacked semiconductor chips may be narrower than the first pitch of the first heat dissipation bumps in the low temperature region of the stacked semiconductor chips so that numbers of the second heat dissipation bumps in the high temperature region of the stacked semiconductor chips may be increased. Thus, heat generated from the high temperature region of the stacked semiconductor chips may be effectively dissipated through the second heat dissipation bumps relatively closely arranged with each other. As a result, the semiconductor package may have low heat resistance.

BRIEF DESCRIPTION OF THE DRAWINGS

Some example embodiments will be more clearly understood from the following detailed description taken in conjunction with the accompanying drawings.

FIG. 1 is a cross-sectional view illustrating a semiconductor package in accordance with some example embodiments;

FIG. 2 is a cross-sectional view illustrating signal bumps of the semiconductor package in FIG. 1;

FIG. 3 is a plan view illustrating a first semiconductor chip of the semiconductor package in FIG. 1;

FIGS. 4 to 6 are cross-sectional views illustrating a method of manufacturing the semiconductor package in FIG. 1;

FIG. 7 is a cross-sectional view illustrating a semiconductor package in accordance with some example embodiments;

FIG. 8 is a plan view illustrating a first semiconductor chip of the semiconductor package in FIG. 7;

FIG. 9 is a cross-sectional view illustrating a semiconductor package in accordance with some example embodiments;

FIG. 10 is a plan view illustrating a first semiconductor chip of the semiconductor package in FIG. 9;

FIG. 11 is a cross-sectional view illustrating a semiconductor package in accordance with some example embodiments;

FIG. 12 is a cross-sectional view illustrating a semiconductor package in accordance with some example embodiments; and FIG. 13 is a cross-sectional view illustrating a semiconductor package in accordance with some example embodiments.

DETAILED DESCRIPTION

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, some example embodiments will be explained in detail with reference to the accompanying drawings.

Figure 1:
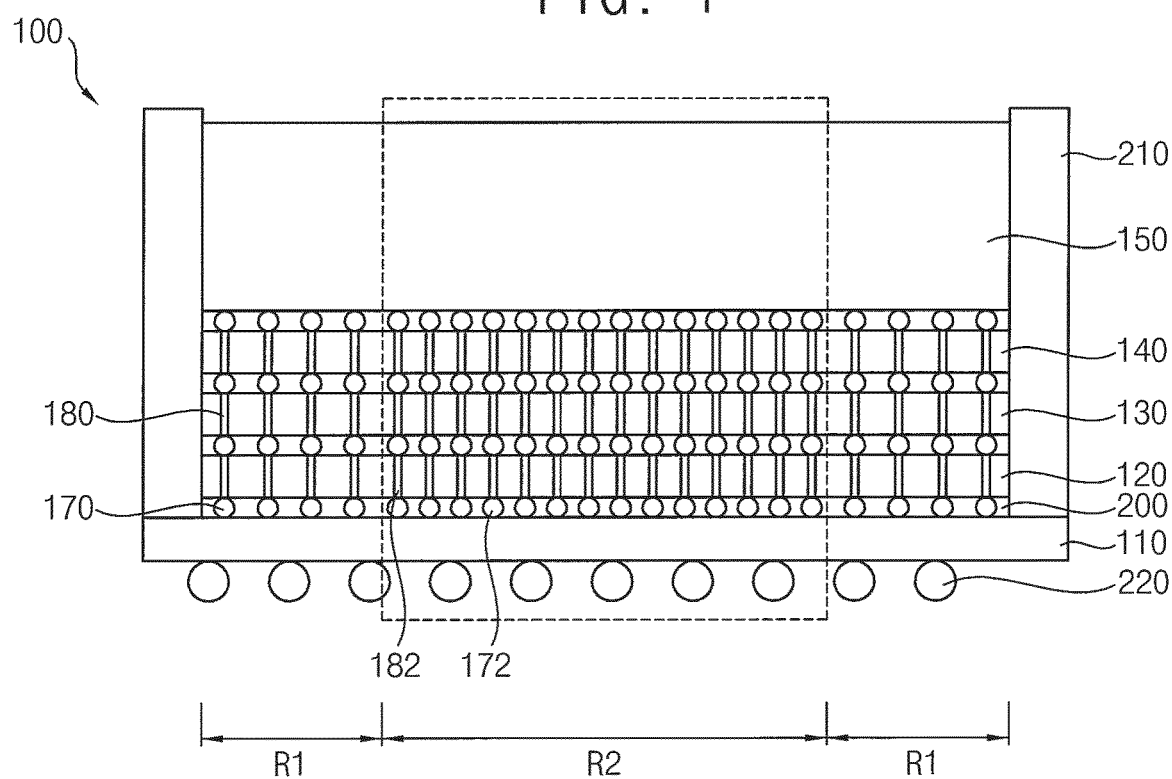
FIGS. 1 to 13 represent non-limiting examples of some example embodiments as described herein.
Figure 2:
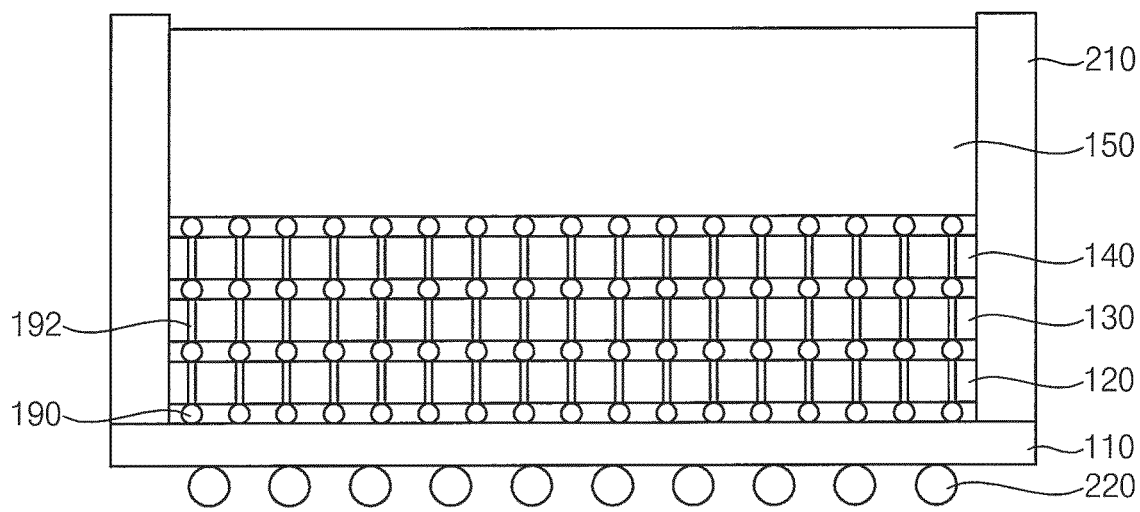
Figure 3:
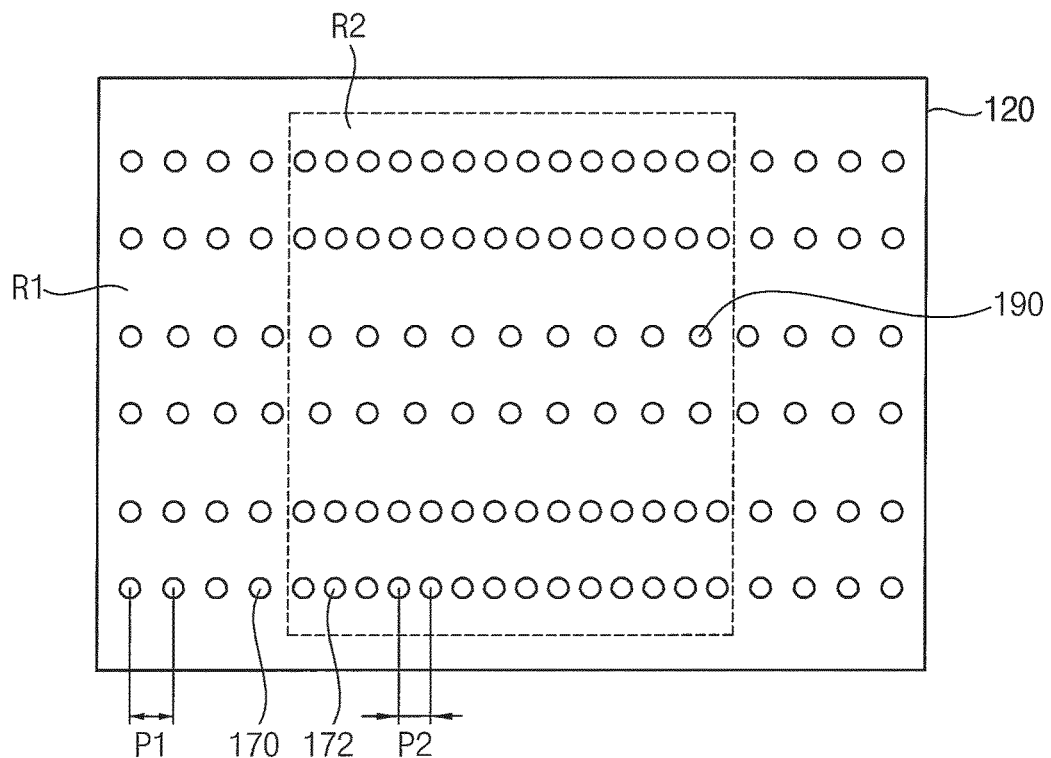

FIG. 1 is a cross-sectional view illustrating a semiconductor package in accordance with some example embodiments, FIG. 2 is a cross-sectional view illustrating signal bumps of the semiconductor package in FIG. 1, and FIG. 3 is a plan view illustrating a first semiconductor chip of the semiconductor package in FIG. 1.

Referring to FIGS. 1 to 3, a semiconductor package 100 of this example embodiment may include a package substrate 110, a plurality of semiconductor chips (e.g., plurality of semiconductor chips such as first to fourth semiconductor chips 120, 130, 140 and 150), signal bumps 190, signal posts 192, first heat dissipation bumps 170, second heat dissipation bumps 172, first heat dissipation posts 180, second heat dissipation posts 182, an underfilling layer 200, a molding member 210 and external terminals 220.

The package substrate 110 may include signal posts. Each of the signal posts may correspond to through silicon via (TSV). The signal posts may be vertically arranged in the package substrate 110. Particularly, the signal posts may be arranged at a central portion of the package substrate 110. Each of the signal posts may include an upper end exposed through an upper surface of the package substrate 110, and a lower end exposed through a lower surface of the package substrate 110. The package substrate 110 may be referred to as a buffer substrate.

The first to fourth semiconductor chips 120, 130, 140 and 150 may be sequentially stacked on the central portion of the upper surface of the package substrate 110. Each of the first to third semiconductor chips 120, 130 and 140 may include the signal posts 192. The signal posts 192 may be vertically arranged in each of the first to third semiconductor chips 120, 130 and 140. Particularly, the signal posts 192 may be arranged at a central portion of the first to third semiconductor chips 120, 130 and 140. Each of the signal posts 192 may include an upper end exposed through an upper surface of each of the first to third semiconductor chips 120, 130 and 140, and a lower end exposed through a lower surface of each of the first to third semiconductor chips 120, 130 and 140.

Because the signal posts 192 may be concentrated on the central portion of the first to third semiconductor chips 120, 130 and 140, the central portion of the first to fourth semiconductor chips 120, 130, 140 and 150 may have a second temperature and an edge portion of the first to fourth semiconductor chips 120, 130, 140 and 150 may have a first temperature lower than the second temperature.

In some example embodiments, the edge portion of the first to fourth semiconductor chips 120, 130, 140 and 150 may be defined as a first region R1 having the first temperature. The central portion of the first to fourth semiconductor chips 120, 130, 140 and 150 may be defined as a second region R2 having the second temperature. The first to fourth semiconductor chips 120, 130, 140, and 150 may be capable of having the first temperature in the first region R1 (e.g., during an operation) and may be capable of having the second temperature (e.g., during an operation) in the second region R2. Here, the first temperature of the first region R1 may be an average value of temperatures in the first region R1. The second temperature of the second region R2 may be an average value of temperatures in the second region R2. Thus, because the second region R2 may correspond to a high temperature region of the first to fourth semiconductor chips 120, 130, 140 and 150, the first region R1 and the second region R2 may be changed in accordance with a temperature distribution of the first to fourth semiconductor chips 120, 130, 140 and 150. That is, the first region R1 may not be restricted within the edge portion of the first to fourth semiconductor chips 120, 130, 140 and 150 and the second region R2 may not be restricted within the central portion of the first to fourth semiconductor chips 120, 130, 140 and 150.

In some example embodiments, the first to fourth semiconductor chips 120, 130, 140 and 150 may include a high bandwidth memory (HBM) chip. In some embodiments, the HBM chip may include stacks of interconnected semiconductor chips (e.g., DRAM). In some embodiments, the HBM chip may comply with a High Bandwidth Memory (HBM) standard released by JEDEC (Joint Electron Device Engineering Council), as well as future evolutions/versions of HBM standards. The first to third semiconductor chips 120, 130 and 140 may be referred to as first to third mid cores, respectively. The uppermost fourth semiconductor chip 150 may be referred to as a top core. However, the first to fourth semiconductor chips 120, 130, 140 and 150 may include other kinds of semiconductor chips besides the HBM chip.

The first to fourth semiconductor chips 120, 130, 140 and 150 may have substantially the same width. The width of the first to fourth semiconductor chips 120, 130, 140 and 150 may be narrower than a width of the package substrate 110. Thus, an edge portion of the upper surface of the package substrate 110 may be upwardly exposed. Alternatively, the width of the first to fourth semiconductor chips 120, 130, 140 and 150 may be substantially the same as the width of the package substrate 110. Further, the first to fourth semiconductor chips 120, 130, 140 and 150 may have different widths.

The first to third semiconductor chips 120, 130 and 140 may have substantially the same thickness. In contrast, the fourth semiconductor chip 150 may have a thickness thicker than the thickness of the first to third semiconductor chips 150. Thus, the first to third semiconductor chips 120, 130 and 140 may have substantially the same size. FIG. 3 may show only the first semiconductor chip 120 among the first to third semiconductor chips 120, 130 and 140. Alternatively, the thickness of the fourth semiconductor chip 150 may be substantially the same as the thickness of the first to third semiconductor chips 120, 130 and 140. Further, the first to fourth semiconductor chips 120, 130, 140 and 150 may have different thicknesses.

The signal bumps 190 may be configured to electrically connect the first to fourth semiconductor chips 120, 130, 140 and 150 with the package substrate 110. Particularly, the signal bumps 190 may be interposed between the package substrate 110 and the first semiconductor chip 120, between the first semiconductor chip 120 and the second semiconductor chip 130, between the second semiconductor chip 130 and the third semiconductor chip 140, and between the third semiconductor chip 140 and the fourth semiconductor chip 150. In some example embodiments, the signal bumps 190 may be arranged in two rows. However, the signal bumps 190 may be arranged in one row or at least three rows.

The signal bumps 190 between the package substrate 110 and the first semiconductor chip 120 may be electrically connect between the signal post of the package substrate 110 and the signal post 192 of the first semiconductor chip 120. The signal bumps 190 between the first semiconductor chip 120 and the second semiconductor chip 130 may be electrically connect between the signal post 192 of the first semiconductor chip 120 and the signal post 192 of the second semiconductor chip 130. The signal bumps 190 between the second semiconductor chip 130 and the third semiconductor chip 140 may be electrically connect between the signal post 192 of the second semiconductor chip 130 and the signal post 192 of the third semiconductor chip 140. The signal bumps 190 between the third semiconductor chip 140 and the fourth semiconductor chip 150 may be electrically connect between the signal post 192 of the third semiconductor chip 140 and the fourth semiconductor chip 150.

As mentioned above, because the signal posts 192 may be concentrated on the central portion of the first to fourth semiconductor chips 120, 130, 140 and 150, the signal bumps 190 may also be concentrated on the central portion of the first to fourth semiconductor chips 120, 130, 140 and 150. Thus, heat generated from the signal bumps 190 configured to transmit signals may be generated from the central portion of the first to fourth semiconductor chips 120, 130, 140 and 150, e.g., the second region R2, so that the second temperature of the second region R2 may be higher than the first temperature of the first region R1.

The first heat dissipation bumps 170 and the second heat dissipation bumps 172 may be configured to dissipate the heat from the first to fourth semiconductor chips 120, 130, 140 and 150. Thus, the first heat dissipation bumps 170 and the second heat dissipation bumps 172 may correspond to dummy bumps through which the signal may not be transmitted.

In some example embodiments, the first heat dissipation bumps 170 and the second heat dissipation bumps 172 may be arranged in two rows. Alternatively, the first heat dissipation bumps 170 and the second heat dissipation bumps 172 may be arranged in one row or at least three rows. Further, the first heat dissipation bumps 170 and the second heat dissipation bumps 172 may be arranged at both sides of the signal bumps 190. However, the first heat dissipation bumps 170 and the second heat dissipation bumps 172 may be positioned at one side of the signal bumps 190. Further, the first heat dissipation bumps 170 and the second heat dissipation bumps 172 may be arranged in a direction substantially parallel to an arranging direction of the signal bumps 190. Alternatively, the first heat dissipation bumps 170 and the second heat dissipation bumps 172 may be arranged in a direction slant to the arranging direction of the signal bumps 190.

The first heat dissipation bumps 170 may be configured to dissipate the heat from the first to fourth semiconductor chips 120, 130, 140 and 150 in the first region R1. Particularly, the first heat dissipation bumps 170 may be arranged between the package substrate 110 and the first semiconductor chip 120 in the first region R1, the first semiconductor chip 120 and the second semiconductor chip 130 in the first region R1, the second semiconductor chip 130 and the third semiconductor chip 140 in the first region R1, and the third semiconductor chip 140 and the fourth semiconductor chip 150 in the first region R1. Particularly, the first heat dissipation bumps 170 may be arranged in the first region R1 by a first pitch P1.

The first heat dissipation posts 180 may be vertically arranged in each of the first to third semiconductor chip 120, 130 and 140. Particularly, the first heat dissipation posts 180 may be positioned in the first region R1 of the first to third semiconductor chips 120, 130 and 140. The first heat dissipation posts 180 may be configured to connect the first heat dissipation bumps 170 with each other in a vertical direction. That is, the first heat dissipation posts 180 may also be arranged by the first pitch P1. Thus, the heat generated from the first region R1 of the first to third semiconductor chips 120, 130 and 140 may be rapidly dissipated from the semiconductor package 100 through the first heat dissipation posts 180 and the first heat dissipation bumps 170.

The second heat dissipation bumps 172 may be configured to dissipate the heat from the first to fourth semiconductor chips 120, 130, 140 and 150 in the second region R2. Particularly, the second heat dissipation bumps 172 may be arranged between the package substrate 110 and the first semiconductor chip 120 in the second region R2, the first semiconductor chip 120 and the second semiconductor chip 130 in the second region R2, the second semiconductor chip 130 and the third semiconductor chip 140 in the second region R2, and the third semiconductor chip 140 and the fourth semiconductor chip 150 in the second region R2. Particularly, the second heat dissipation bumps 172 may be arranged in the second region R2 by a second pitch P2.

In some example embodiments, the second pitch P2 may be narrower than the first pitch P1. The second pitch P2 may be no more than about ½ times the first pitch P1. For example, when the first pitch P1 may be about 60 μm, the second pitch P2 may be no more than about 30 μm. Thus, numbers of the second heat dissipation bumps 172 in the second region R2 by the second pitch P2 may be more than numbers of the second heat dissipation bumps 172 in the second region by the first pitch P1. For example, a density (e.g., number of bumps per length of row or area region) of the second heat dissipation bumps 172 in a row in the second region R2 may be greater than a density of the first heat dissipation bumps 170 in a row in the first region R1. As a result, heat dissipation efficiency of the second region R2 may be greatly improved by the second heat dissipation bumps 172. The heat dissipation efficiency of the second region R2 may be greater than the heat dissipation efficiency of the first region R1.

The second heat dissipation posts 182 may be vertically arranged in each of the first to third semiconductor chip 120, 130 and 140. Particularly, the second heat dissipation posts 182 may be positioned in the second region R2 of the first to third semiconductor chips 120, 130 and 140. The second heat dissipation posts 182 may be configured to connect the second heat dissipation bumps 172 with each other in the vertical direction. That is, the second heat dissipation posts 182 may also be arranged by the second pitch P2. Thus, the heat generated from the second region R2 of the first to third semiconductor chips 120, 130 and 140 may be rapidly dissipated from the semiconductor package 100 through the second heat dissipation posts 182 and the second heat dissipation bumps 172.

The underfilling layer 200 may be configured to fill spaces between the package substrate 110 and the first semiconductor chip 120, between the first semiconductor chip 120 and the second semiconductor chip 130, between the second semiconductor chip 130 and the third semiconductor chip 140, and between the third semiconductor chip 140 and the fourth semiconductor chip 150. Thus, the signal bumps 190, the first heat dissipation bumps 170 and the second heat dissipation bumps 172 may be surrounded by the underfilling layer 200. Particularly, because the numbers of the second heat dissipation bumps 172 in the second region R2 may be increased, an area of the underfilling layer 200 having a low thermal conductivity may be relatively reduced. Thus, the heat dissipation characteristic of the semiconductor package 100 may be improved. In some example embodiments, the underfilling layer 200 may include a non-conductive film (NCF).

The molding member 210 may be formed on the exposed edge portion of the upper surface of the package substrate 110 to surround the side surfaces of the first to fourth semiconductor chips 120, 130, 140 and 150. In contrast, the molding member 210 may not be formed on an upper surface of the fourth semiconductor chip 150 to expose the upper surface of the fourth semiconductor chip 150. Thus, the heat in the first region R1 and the second region R2 may be rapidly dissipated through the exposed upper surface of the fourth semiconductor chip 150 via the first heat dissipation bumps 170 and the second heat dissipation bumps 172. The molding member 210 may include an epoxy molding compound (EMC).

The external terminals 220 may be mounted on a lower surface of the package substrate 110. The external terminals 220 may be electrically connected to the lower ends of the signal posts in the package substrate 110. The external terminals 220 may include solder balls.

Figure 4:
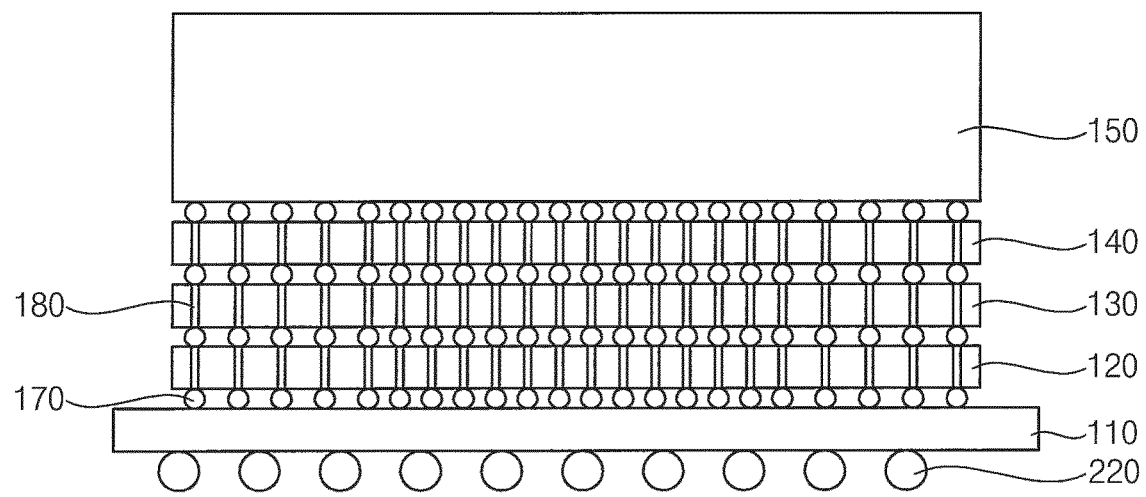
Figure 5:
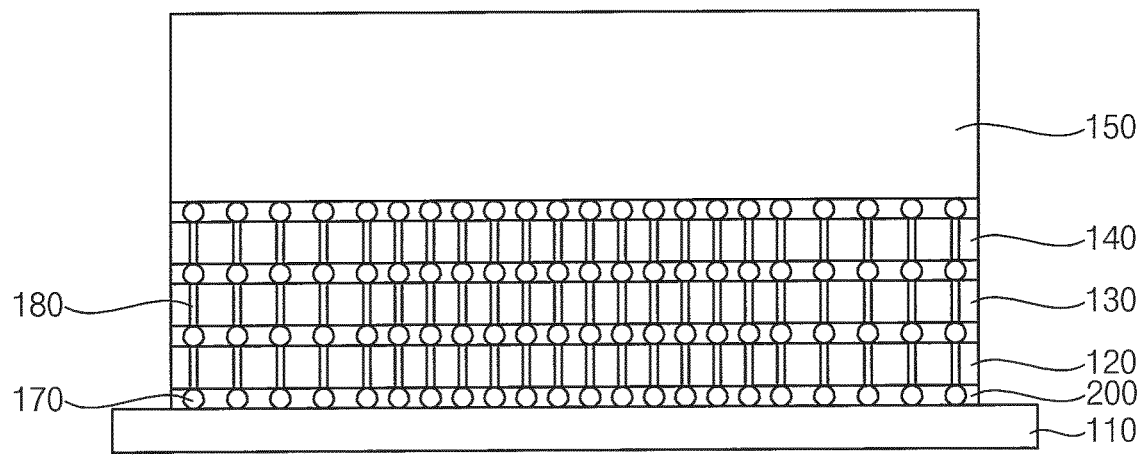
Figure 6:
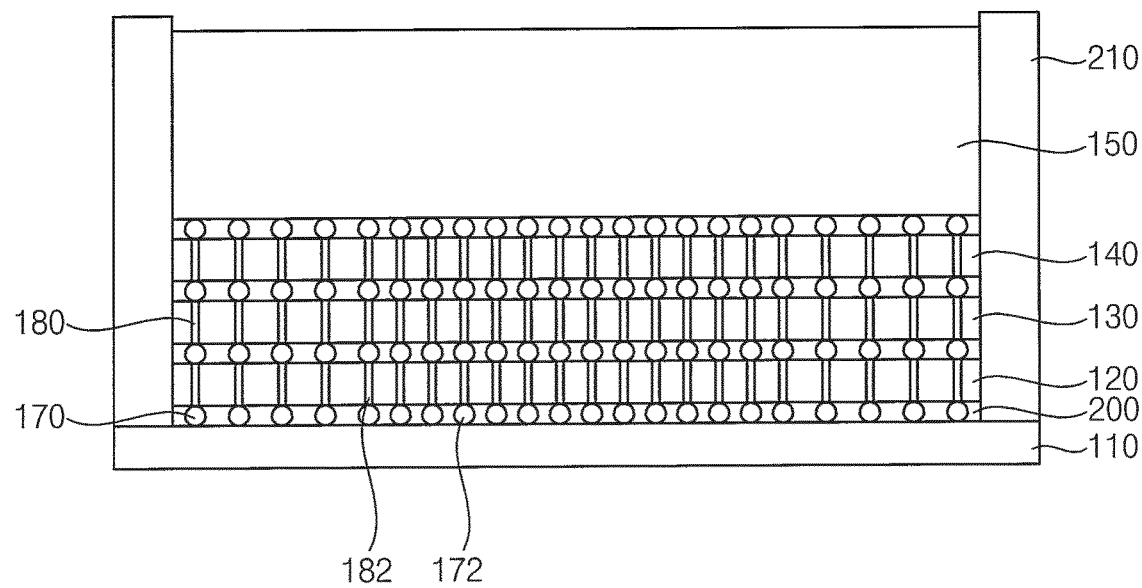

FIGS. 4 to 6 are cross-sectional views illustrating a method of manufacturing the semiconductor package in FIG. 1.

Referring to FIG. 4, the first to fourth semiconductor chips 120, 130, 140 and 150 may be sequentially stacked on the upper surface of the package substrate 110.

The signal bumps 190 may be interposed between the package substrate 110 and the first semiconductor chip 120, between the first semiconductor chip 120 and the second semiconductor chip 130, between the second semiconductor chip 130 and the third semiconductor chip 140, and between the third semiconductor chip 140 and the fourth semiconductor chip 150. The signal bumps 190 may be electrically connected to the signal posts 192.

The first heat dissipation bumps 170 may be interposed between the package substrate 110 and the first semiconductor chip 120 in the first region R1, between the first semiconductor chip 120 and the second semiconductor chip 130 in the first region R1, between the second semiconductor chip 130 and the third semiconductor chip 140 in the first region R1, and between the third semiconductor chip 140 and the fourth semiconductor chip 150 in the first region R1. The first heat dissipation bumps 170 may be electrically connected to the first heat dissipation posts 180.

The second heat dissipation bumps 172 may be interposed between the package substrate 110 and the first semiconductor chip 120 in the second region R2, between the first semiconductor chip 120 and the second semiconductor chip 130 in the second region R2, between the second semiconductor chip 130 and the third semiconductor chip 140 in the second region R2, and between the third semiconductor chip 140 and the fourth semiconductor chip 150 in the second region R2. The second heat dissipation bumps 172 may be electrically connected to the second heat dissipation posts 182.

Referring to FIG. 5, the underfilling layer 200 may be formed in the spaces between the package substrate 110 and the first semiconductor chip 120, between the first semiconductor chip 120 and the second semiconductor chip 130, between the second semiconductor chip 130 and the third semiconductor chip 140, and between the third semiconductor chip 140 and the fourth semiconductor chip 150. Thus, the signal bumps 190, the first heat dissipation bumps 170 and the second heat dissipation bumps 172 may be surrounded by the underfilling layer 200.

Referring to FIG. 6, the molding member 210 may be formed on the exposed edge portion of the upper surface of the package substrate 110 to surround the side surfaces of the first to fourth semiconductor chips 120, 130, 140 and 150.

The external terminals 220 may be mounted on the lower surface of the package substrate 110 to complete the semiconductor package 100 in FIG. 1.

Figure 7:
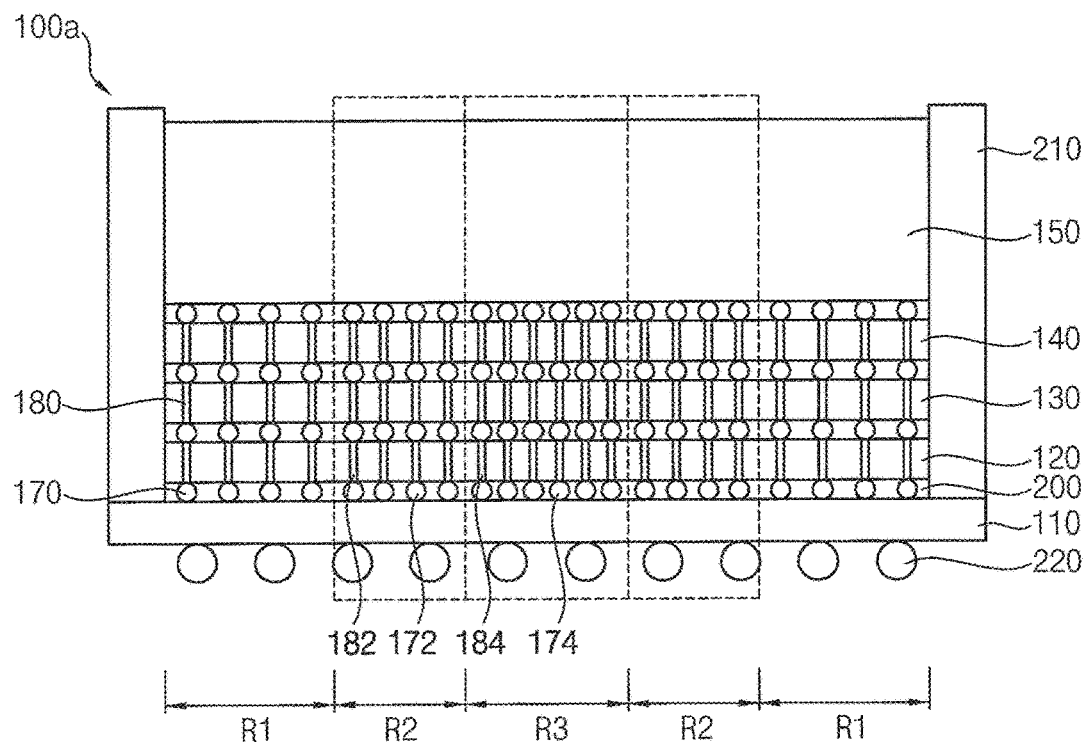
Figure 8:
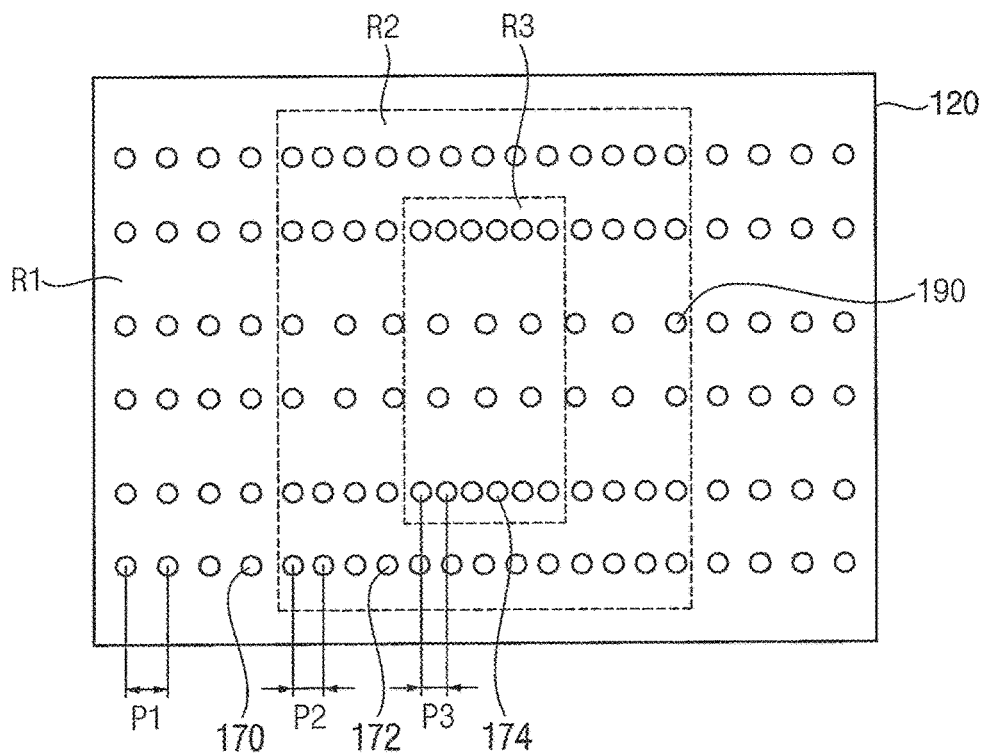

FIG. 7 is a cross-sectional view illustrating a semiconductor package in accordance with some example embodiments, and FIG. 8 is a plan view illustrating a first semiconductor chip of the semiconductor package in FIG. 7.

A semiconductor package 100a of this example embodiment may include elements substantially the same as those of the semiconductor package 100 in FIG. 1 except for heat dissipation bumps and heat dissipation posts. Thus, the same reference numerals may refer to the same elements and any further illustrations with respect to the same elements may be omitted herein for brevity.

Referring to FIGS. 7 and 8, the first to fourth semiconductor chips 120, 130, 140 and 150 may be classified into a first region R1, a second region R2 and a third region R3. The first region R1 and the second region R2 in FIGS. 7 and 8 may be substantially the same as the first region R1 and the second region R2 in FIG. 1. Thus, any further illustrations with respect to the first region R1 and the second region R2 may be omitted herein for brevity.

The third region R3 may be positioned in the second region R2. Thus, the third region R3 may be surrounded by the second region R2. The third region R3 may be capable of having a third temperature (e.g., during an operation) higher than the second temperature of the second region R2.

Heat dissipation bumps may include first heat dissipation bumps 170, second heat dissipation bumps 172 and third heat dissipation bumps 174. The first heat dissipation bumps 170 and the second heat dissipation bumps 172 in FIGS. 7 and 8 may be substantially the same as the first heat dissipation bumps 170 and the second heat dissipation bumps 180 in FIG. 1, respectively. Thus, any further illustrations with respect to the first heat dissipation bumps 170 and the second heat dissipation bumps 172 may be omitted herein for brevity.

The third heat dissipation bumps 174 may be configured to dissipate the heat from the first to fourth semiconductor chips 120, 130, 140 and 150 in the third region R3. Particularly, the third heat dissipation bumps 174 may be arranged between the package substrate 110 and the first semiconductor chip 120 in the third region R3, the first semiconductor chip 120 and the second semiconductor chip 130 in the third region R3, the second semiconductor chip 130 and the third semiconductor chip 140 in the third region R3, and the third semiconductor chip 140 and the fourth semiconductor chip 150 in the third region R3. Particularly, the third heat dissipation bumps 174 may be arranged in the third region R3 by a third pitch P3.

In some example embodiments, the third pitch P3 may be narrower than the second pitch P2. The third pitch P3 may be no more than about ½ times the second pitch P2. For example, when the second pitch P2 may be about 30 μm, the third pitch P3 may be no more than about 15 μm. Thus, numbers of the third heat dissipation bumps 174 in the third region R3 by the third pitch P3 may be increased. For example, a density (e.g., number of bumps per length of row or area region) of the third heat dissipation bumps 174 in a row in the third region R3 may be greater than a density of the second heat dissipation bumps 172 in a row in the second region R2. As a result, heat dissipation efficiency of the third region R3 may be greatly improved by the third heat dissipation bumps 174. The heat dissipation efficiency of the third region R3 may be greater than the heat dissipation efficiency of the second region R2.

Third heat dissipation posts 184 may be vertically arranged in each of the first to third semiconductor chip 120, 130 and 140. Particularly, the third heat dissipation posts 184 may be positioned in the third region R3 of the first to third semiconductor chips 120, 130 and 140. The third heat dissipation posts 184 may be configured to connect the third heat dissipation bumps 174 with each other in the vertical direction. That is, the third heat dissipation posts 184 may also be arranged by the third pitch P3. Thus, the heat generated from the third region R3 of the first to third semiconductor chips 120, 130 and 140 may be rapidly dissipated from the semiconductor package 100 through the third heat dissipation posts 184 and the third heat dissipation bumps 174.

In some example embodiments, the first to fourth semiconductor chips 120, 130, 140 and 150 may be classified into the two or three regions. Alternatively, the first to fourth semiconductor chips 120, 130, 140 and 150 may be classified into at least four regions.

Figure 9:
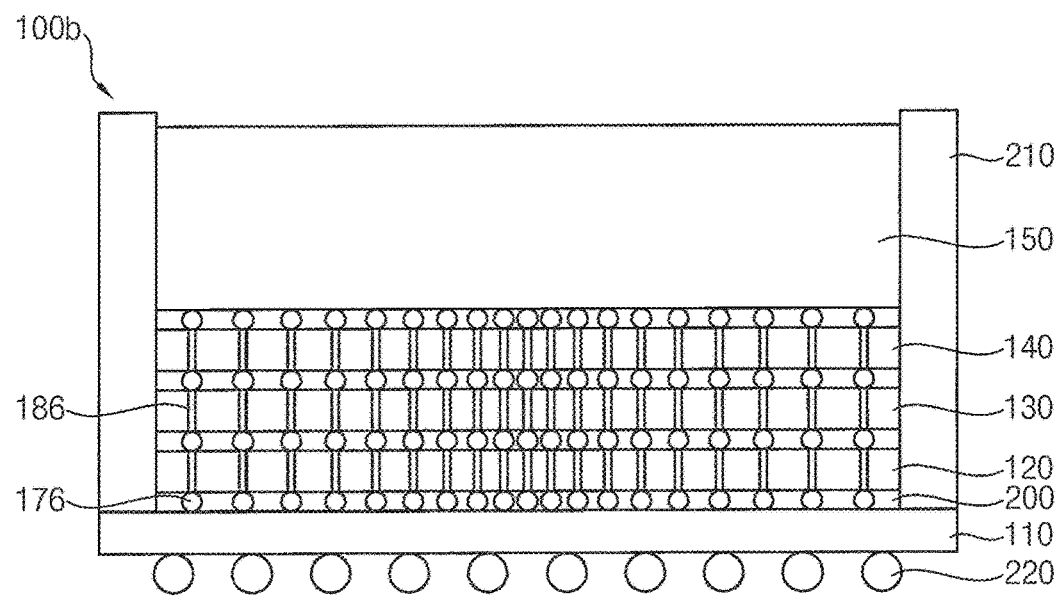
Figure 10:
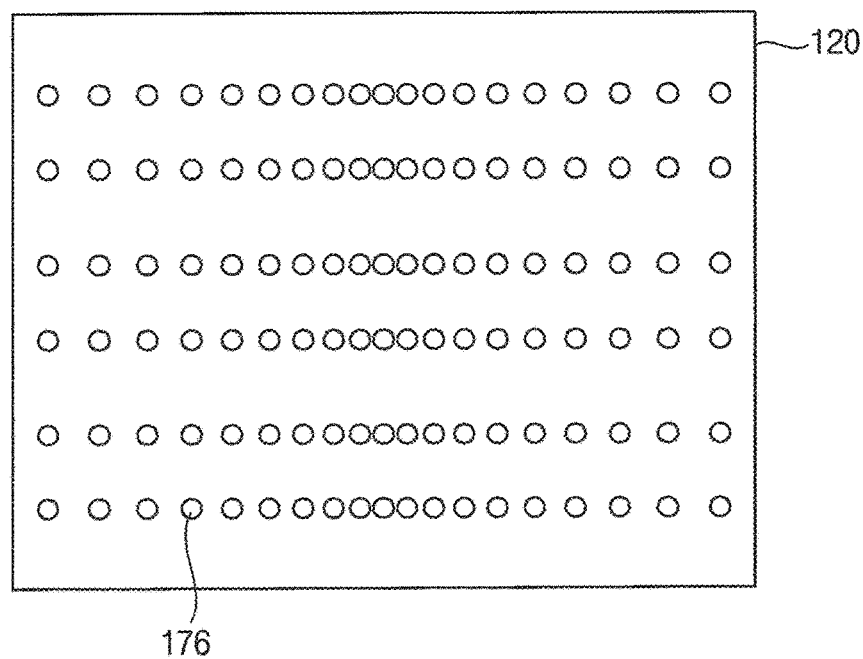

FIG. 9 is a cross-sectional view illustrating a semiconductor package in accordance with some example embodiments, and FIG. 10 is a plan view illustrating a first semiconductor chip of the semiconductor package in FIG. 9.

A semiconductor package 100b of this example embodiment may include elements substantially the same as those of the semiconductor package 100 in FIG. 1 except for heat dissipation bumps and heat dissipation posts. Thus, the same reference numerals may refer to the same elements and any further illustrations with respect to the same elements may be omitted herein for brevity.

As mentioned above, because the signal bumps 190 may be arranged at the central portion of the first to fourth semiconductor chips 120, 130, 140 and 150, the central portion of the first to fourth semiconductor chips 120, 130, 140 and 150 may have the highest temperature. In contrast, the edge portion of the first to fourth semiconductor chips 120, 130, 140 and 150 may have the lowest temperature. Thus, the temperature may be gradually increased from the edge portion of the first to fourth semiconductor chips 120, 130, 140 and 150 to the central portion of the first to fourth semiconductor chip 120, 130, 140 and 150.

Referring to FIGS. 9 and 10, heat dissipation bumps 176 may be arranged from the edge portion of the first to fourth semiconductor chips 120, 130, 140 and 150 to the central portion of the first to fourth semiconductor chips 120, 130, 140 and 150 by gradually decreased pitches. That is, a pitch between an outermost heat dissipation bump 176 and the next heat dissipation bump 176 may be the widest. In contrast, a pitch between a central heat dissipation bump 176 and the next heat dissipation bump 176 may be the narrowest.

Therefore, heat dissipation posts 186 configured to vertically connect the heat dissipation bumps 176 with each other may be arranged by pitches substantially the same as the pitches between the heat dissipation bumps 176. That is, the heat dissipation posts 186 may also be arranged from the edge portion of the first to fourth semiconductor chips 120, 130, 140 and 150 from the central portion of the first to fourth semiconductor chips 120, 130, 140 and 150 by the gradually decreased pitches.

Figure 11:
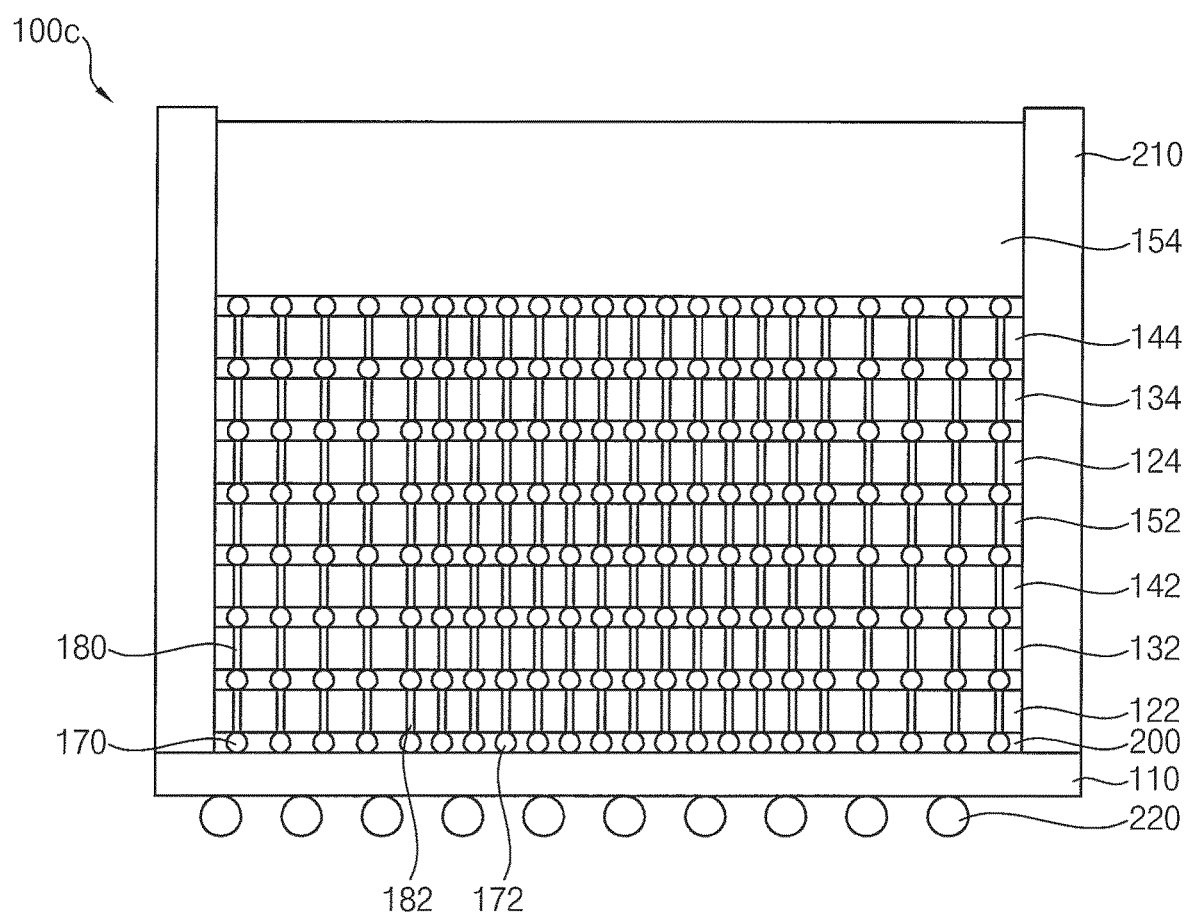

FIG. 11 is a cross-sectional view illustrating a semiconductor package in accordance with some example embodiments.

A semiconductor package 100c of this example embodiment may include elements substantially the same as those of the semiconductor package 100 in FIG. 1 except for numbers of a semiconductor chip. Thus, the same reference numerals may refer to the same elements and any further illustrations with respect to the same elements may be omitted herein for brevity.

Referring to FIG. 11, a semiconductor package 100c of this example embodiment may include a plurality of semiconductor chips (at least two) sequentially stacked, such as first to eighth semiconductor chips 122, 132, 142, 152, 124, 134, 144 and 154.

In some example embodiments, the first to eighth semiconductor chips 122, 132, 142, 152, 124, 134, 144 and 154 may include HBM chips. However, the first to eighth semiconductor chips 122, 132, 142, 152, 124, 134, 144 and 154 may include other kinds of semiconductor chips besides the HBM chips.

In some example embodiments, the first to eighth semiconductor chips 122, 132, 142, 152, 124, 134, 144 and 154 may have substantially the same width. The width of the first to eighth semiconductor chips 122, 132, 142, 152, 124, 134, 144 and 154 may be narrower than the width of the package substrate 110. Thus, the edge portion of the upper surface of the package substrate 110 may be upwardly exposed. Alternatively, the width of the first to eighth semiconductor chips 122, 132, 142, 152, 124, 134, 144 and 154 may be substantially the same as the width of the package substrate 110. Further, the first to eighth semiconductor chips 122, 132, 142, 152, 124, 134, 144 and 154 may have different widths.

In some example embodiments, the first to seventh semiconductor chips 122, 132, 142, 152, 124, 134 and 144 may have substantially the same thickness. In contrast, the eighth semiconductor chip 154 may have a thickness thicker than the thickness of the first to seventh semiconductor chips 122, 132, 142, 152, 124, 134 and 144. Thus, the first to seventh semiconductor chips 122, 132, 142, 152, 124, 134 and 144 may have substantially the same size. Alternatively, the thickness of the eighth semiconductor chip 154 may be substantially the same as the thickness of the first to seventh semiconductor chips 122, 132, 142, 152, 124, 134 and 144. Further, the first to eighth semiconductor chips 122, 132, 142, 152, 124, 134, 144 and 154 may have different thicknesses.

Alternatively, the heat dissipation bumps 170, 172 and 174 in FIG. 7 or the heat dissipation bumps 176 in FIG. 9 may be applied to the semiconductor package 100c of this example embodiment.

Figure 12:
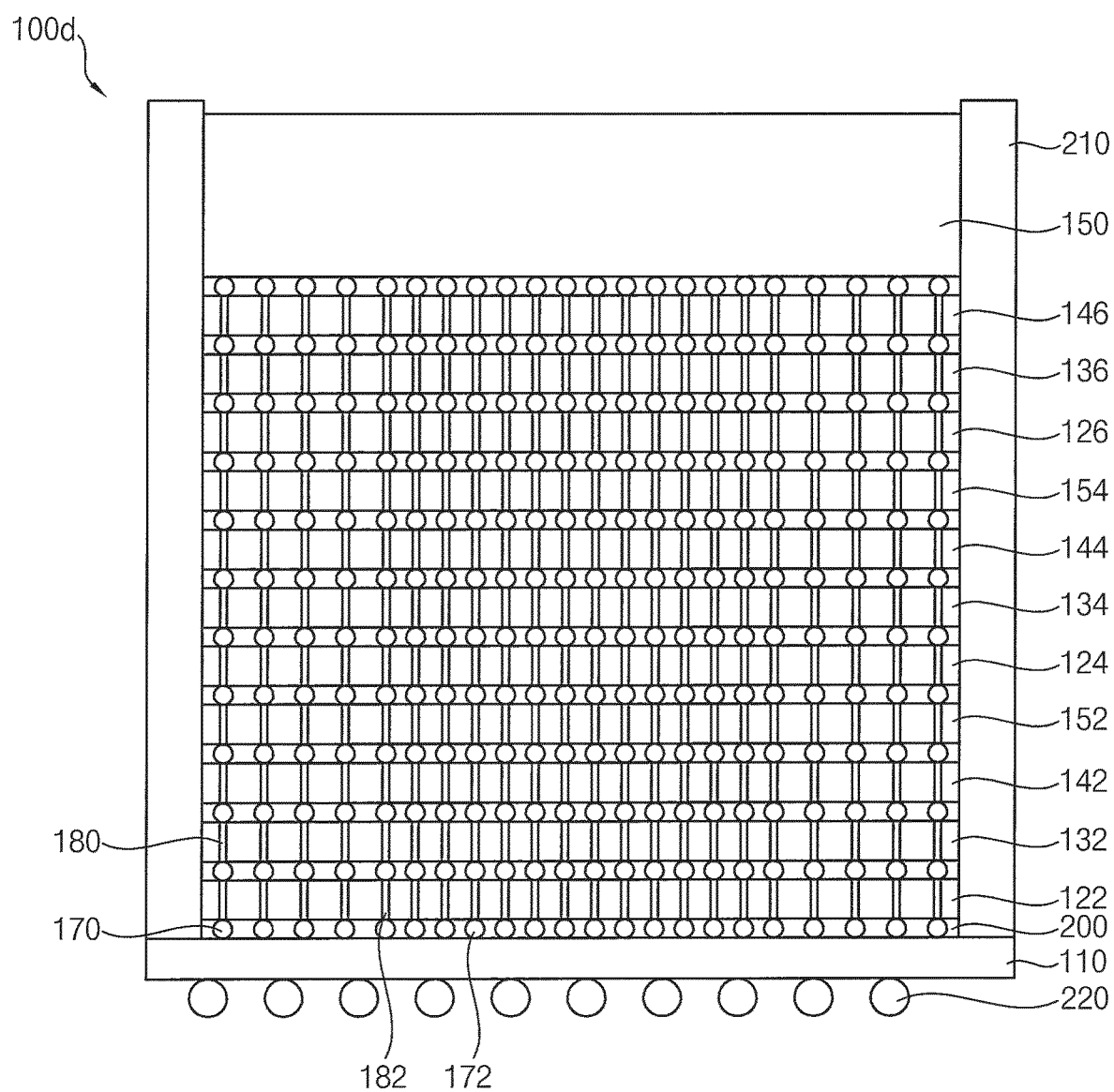

FIG. 12 is a cross-sectional view illustrating a semiconductor package in accordance with some example embodiments.

A semiconductor package 100d of this example embodiment may include elements substantially the same as those of the semiconductor package 100 in FIG. 1 except for numbers of a semiconductor chip. Thus, the same reference numerals may refer to the same elements and any further illustrations with respect to the same elements may be omitted herein for brevity.

Referring to FIG. 12, a semiconductor package 100d of this example embodiment ma include sequentially stacked first to twelfth semiconductor chips 122, 132, 142, 152, 124, 134, 144, 154, 126, 136, 146 and 156.

In some example embodiments, the first to twelfth semiconductor chips 122, 132, 142, 152, 124, 134, 144, 154, 126, 136, 146 and 156 may include HBM chips. However, the first to twelfth semiconductor chips 122, 132, 142, 152, 124, 134, 144, 154, 126, 136, 146 and 156 may include other kinds of semiconductor chips besides the HBM chips.

In some example embodiments, the first to twelfth semiconductor chips 122, 132, 142, 152, 124, 134, 144, 154, 126, 136, 146 and 156 may have substantially the same width. The width of the first to twelfth semiconductor chips 122, 132, 142, 152, 124, 134, 144, 154, 126, 136, 146 and 156 may be narrower than the width of the package substrate 110. Thus, the edge portion of the upper surface of the package substrate 110 may be upwardly exposed. Alternatively, the width of the first to twelfth semiconductor chips 122, 132, 142, 152, 124, 134, 144, 154, 126, 136, 146 and 156 may be substantially the same as the width of the package substrate 110. Further, the first to twelfth semiconductor chips 122, 132, 142, 152, 124, 134, 144, 154, 126, 136, 146 and 156 may have different widths.

In some example embodiments, the first to eleventh semiconductor chips 122, 132, 142, 152, 124, 134, 144, 154, 126, 136 and 146 may have substantially the same thickness. In contrast, the twelfth semiconductor chip 156 may have a thickness thicker than the thickness of the first to eleventh semiconductor chips 122, 132, 142, 152, 124, 134, 144, 154, 126, 136 and 146. Thus, the first to eleventh semiconductor chips 122, 132, 142, 152, 124, 134, 144, 154, 126, 136 and 146 may have substantially the same size. Alternatively, the thickness of the twelfth semiconductor chip 156 may be substantially the same as the thickness of the first to eleventh semiconductor chips 122, 132, 142, 152, 124, 134, 144, 154, 126, 136 and 146. Further, the first to twelfth semiconductor chips 122, 132, 142, 152, 124, 134, 144, 154, 126, 136, 146 and 156 may have different thicknesses.

Alternatively, the heat dissipation bumps 170, 172 and 174 in FIG. 7 or the heat dissipation bumps 176 in FIG. 9 may be applied to the semiconductor package 100d of this example embodiment.

In some example embodiments, the semiconductor packages may include the four tiers, the eight tiers and the twelve tiers, but is not limit thereto. Alternatively, the semiconductor packages may have a structure including the semiconductor chips with at least two tiers.

Figure 13:
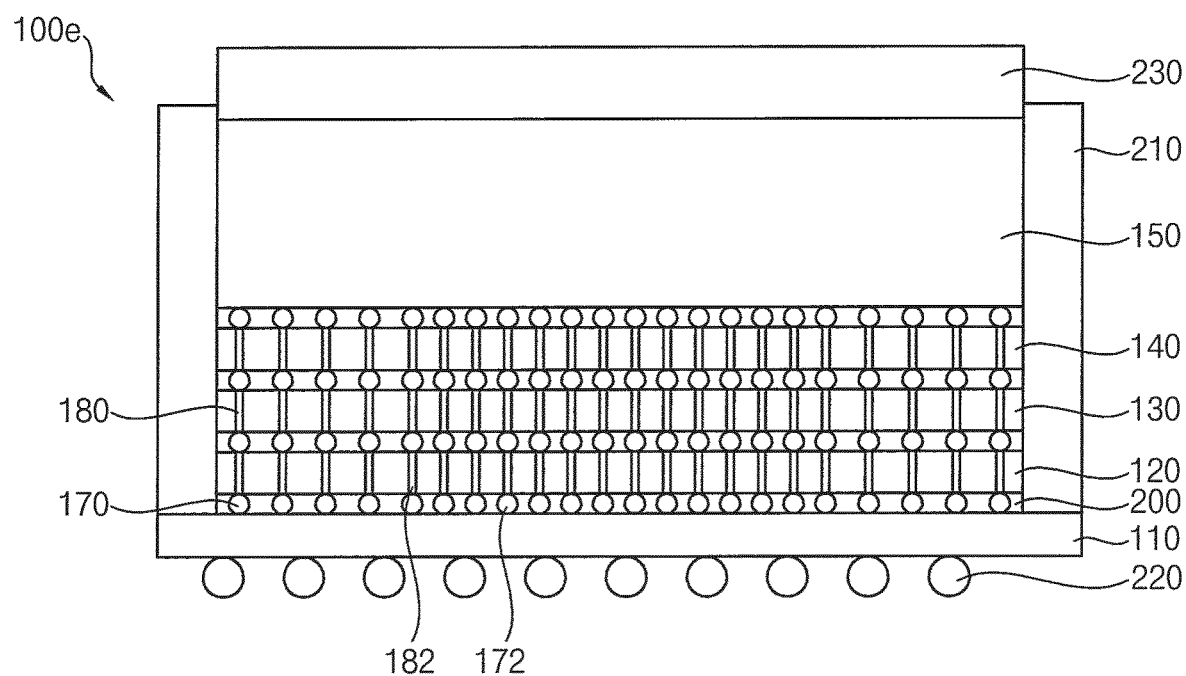

FIG. 13 is a cross-sectional view illustrating a semiconductor package in accordance with some example embodiments.

A semiconductor package 100e of this example embodiment may include elements substantially the same as those of the semiconductor package 100 in FIG. 1 except for further including a heat sink. Thus, the same reference numerals may refer to the same elements and any further illustrations with respect to the same elements may be omitted herein for brevity.

Referring to FIG. 13, a heat sink 230 may be attached to the exposed upper surface of the fourth semiconductor chip 150. The heat sink 230 may be configured to dissipate the heat transferred to the fourth semiconductor chip 150 through the heat dissipation bumps 170 and 172 and the heat dissipation posts 180 and 182 to the outside of the semiconductor package 100e.

Therefore, the heat sink 230 may include a material having a high thermal conductivity such as a metal. However, the heat sink 230 may include other materials, not restricted within the metal.

Further, the heat sink 230 may be applied to the semiconductor package 100a in FIG. 7, the semiconductor package 100b in FIG. 9, the semiconductor package 100c in FIG. 11 or the semiconductor package 100d in FIG. 12.

According to some example embodiments, the second pitch of the second heat dissipation bumps in the high temperature region of the stacked semiconductor chips may be narrower than the first pitch of the first heat dissipation bumps in the low temperature region of the stacked semiconductor chips so that numbers of the second heat dissipation bumps in the high temperature region of the stacked semiconductor chips may be increased. Thus, heat generated from the high temperature region of the stacked semiconductor chips may be effectively dissipated through the second heat dissipation bumps relatively closely arranged with each other. As a result, the semiconductor package may have low heat resistance.

The foregoing is illustrative of some example embodiments and is not to be construed as limiting thereof. Although a few example embodiments have been described, those skilled in the art will readily appreciate that many modifications are possible without materially departing from the novel teachings and effects of inventive concepts. Accordingly, all such modifications are intended to be included within the scope of some example embodiments as defined in the claims.

What is claimed is:

1. A semiconductor package comprising:
   a package substrate including through silicon vias vertically arranged in the package substrate;

a plurality of semiconductor chips stacked on an upper surface of the package substrate, the plurality of semiconductor chips including a first region and a second region and each of the plurality of semiconductor chips having a size smaller than a size of the package substrate;

a plurality of first bumps arranged between the plurality of semiconductor chips in the central region;

a plurality of second bumps arranged between the plurality of semiconductor chips in the first region by a first pitch; and a plurality of third bumps arranged between the plurality of semiconductor chips in the second region by a second pitch, the second pitch being narrower than the first pitch.

2. The semiconductor package of claim 1, wherein
the second region corresponds to a central portion of the plurality of semiconductor chips,
the first region corresponds to an edge portion of the plurality of semiconductor chips, and
the first region surrounds the second region.

3. The semiconductor package of claim 1, wherein the second pitch is no more than about ½ times the first pitch.

4. The semiconductor package of claim 3, wherein
the first pitch is about 60 μm, and
the second pitch is no more than about 30 μm.

5. The semiconductor package of claim 1, wherein the second bumps and the third bumps are at both sides of the plurality of first bumps.

6. The semiconductor package of claim 1, further comprising:
a heat sink on an upper surface of an uppermost semiconductor chip among the plurality of semiconductor chips.

7. The semiconductor package of claim 1, wherein the plurality of first bumps is between the package substrate and a lowermost semiconductor chip among the plurality of semiconductor chips.

8. The semiconductor package of claim 1, wherein the second bumps and the third bumps are between the package substrate and a lowermost semiconductor chip among the plurality of semiconductor chips.

9. The semiconductor package of claim 1, further comprising:
an underfilling layer between the plurality of semiconductor chips, wherein the underfilling layer surrounds the plurality of first bumps, the plurality of second bumps, and the plurality of third bumps.

10. The semiconductor package of claim 9, wherein the underfilling layer is between the package substrate and a lowermost semiconductor chip among the plurality of semiconductor chips.

11. The semiconductor package of claim 1, wherein the plurality of semiconductor chips comprise a high bandwidth memory (HBM) chip.

12. The semiconductor package of claim 1, wherein the plurality of semiconductor chips are four semiconductor chips, eight semiconductor chips, or twelve semiconductor chips.

13. The semiconductor package of claim 12, wherein a thickness of an uppermost semiconductor chip among the plurality of semiconductor chips is thicker than a thickness of remaining semiconductor chips among the plurality of semiconductor chips.

14. The semiconductor package of claim 13, wherein the remaining semiconductor chips have substantially a same thickness.

15. The semiconductor package of claim 1, wherein the plurality of semiconductor chips have substantially a same width.

16. The semiconductor package of claim 1, further comprising:
a molding member on the upper surface of the package substrate, the molding member surrounding side surfaces of the plurality of semiconductor chips; and
external terminals mounted on a lower surface of the package substrate.

17. A semiconductor package comprising:
a package substrate including through silicon vias vertically arranged in the package substrate;
a plurality of semiconductor chips stacked on an upper surface of the package substrate, the plurality of semiconductor chips including a first region, a second region and a third region;
a plurality of first bumps arranged between the plurality of semiconductor chips in the central region;
a plurality of second bumps arranged between the plurality of semiconductor chips in the first region by a first pitch;
a plurality of third bumps arranged between the plurality of semiconductor chips in the second region by a second pitch, the second pitch being narrower than the first pitch such that the second region has a higher heat dissipation efficiency than the first region; and
a plurality of fourth bumps arranged between the plurality of semiconductor chips in the third region by a third pitch narrower than the second pitch such that the third region has a higher heat dissipation efficiency than the second region.

18. The semiconductor package of claim 17, wherein
the first region corresponds to an edge portion of the plurality of semiconductor chips, the third region corresponds to a central portion of the plurality of semiconductor chips, the first region corresponds to an edge portion of the plurality of semiconductor chips, and the second region is between the first region and the third region.

19. The semiconductor package of claim 17, further comprising:
a heat sink on an upper surface of an uppermost semiconductor chip among the plurality of semiconductor chips.

20. The semiconductor package of claim 17, further comprising:
an underfilling layer between the plurality of semiconductor chips, wherein the underfilling layer surrounds the plurality of first bumps, the plurality of second bumps, the plurality of third bumps and the plurality of third heat dissipation bumps.

* * * * *